(12) United States Patent
Suh

(10) Patent No.: US 9,637,647 B2
(45) Date of Patent: May 2, 2017

(54) PHOTONIC SINTERING OF A POLYMER THICK FILM COPPER CONDUCTOR COMPOSITION

(71) Applicant: E I DU PONT DE NEMOURS AND COMPANY, Wilmington, DE (US)

(72) Inventor: Seigi Suh, Cary, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 114 days.

(21) Appl. No.: 14/862,254

(22) Filed: Sep. 23, 2015

(65) Prior Publication Data

US 2017/0044383 A1    Feb. 16, 2017

Related U.S. Application Data

(60) Provisional application No. 62/204,581, filed on Aug. 13, 2015.

(51) Int. Cl.
| | | |
|---|---|---|
| *C09D 5/24* | (2006.01) | |
| *B05D 5/12* | (2006.01) | |
| *C08G 73/10* | (2006.01) | |
| *H01B 1/22* | (2006.01) | |
| *H05K 1/09* | (2006.01) | |
| *H05K 3/10* | (2006.01) | |

(52) U.S. Cl.
CPC .............. *C09D 5/24* (2013.01); *B05D 5/12* (2013.01); *C08G 73/1039* (2013.01); *C08G 73/1042* (2013.01); *H01B 1/22* (2013.01); *H05K 1/095* (2013.01); *H05K 3/102* (2013.01)

(58) Field of Classification Search
CPC ... H01B 1/00; H01B 1/16; H01B 1/22; B05D 5/12; C09D 5/24; C09D 11/52
See application file for complete search history.

(56) References Cited

U.S. PATENT DOCUMENTS

| | | |
|---|---|---|
| 4,663,079 A | 5/1987 | Yamaguchi et al. |
| 5,064,469 A | 11/1991 | Mack |
| 5,204,025 A | 4/1993 | Yamada et al. |
| 5,284,899 A * | 2/1994 | Morishige ............... C08K 3/04 524/403 |
| 9,190,188 B2 | 11/2015 | Summers |
| 2008/0020304 A1 | 1/2008 | Schroder et al. |

(Continued)

FOREIGN PATENT DOCUMENTS

| | | |
|---|---|---|
| EP | 0239901 A2 | 10/1987 |
| JP | 362074967 A | 4/1987 |

(Continued)

OTHER PUBLICATIONS (PCT/US2014/041196) International Search Report and Written Opinion dated Mar. 31, 2015.

*Primary Examiner* — Mark Kopec

(57) ABSTRACT

This invention provides a polymer thick film copper conductor composition for forming an electrical conductor and a method for using the polymer thick film copper conductor composition to form an electrical conductor in an electrical circuit. The method subjects the deposited thick film copper conductor composition to photonic sintering. The invention further provides electrical devices containing electrical conductors made from the polymer thick film copper conductor composition and also those formed by the method.

13 Claims, 1 Drawing Sheet

(56) References Cited

U.S. PATENT DOCUMENTS

| | | |
|---|---|---|
| 2009/0181184 A1 | 7/2009 | Pope et al. |
| 2011/0180137 A1 | 7/2011 | Iwamuro et al. |
| 2012/0119153 A1 | 5/2012 | Choi |
| 2013/0001774 A1 | 1/2013 | Masumori et al. |
| 2013/0142963 A1 | 6/2013 | Kirk et al. |

FOREIGN PATENT DOCUMENTS

| | | |
|---|---|---|
| JP | 362230869 A | 10/1987 |
| JP | 401020276 A | 1/1989 |
| WO | 2009111393 A2 | 9/2009 |

\* cited by examiner

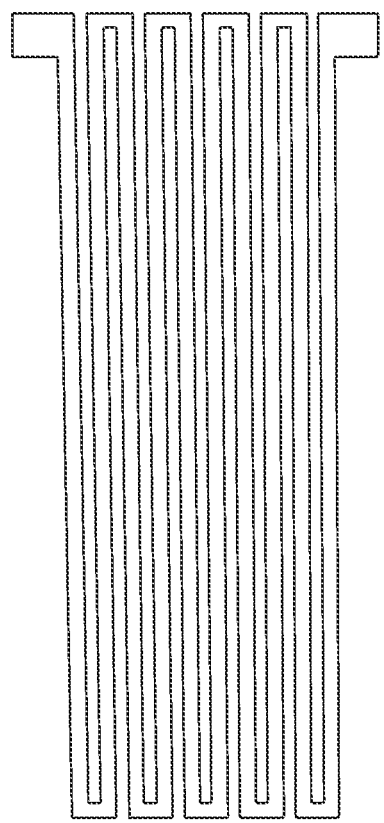

PHOTONIC SINTERING OF A POLYMER THICK FILM COPPER CONDUCTOR COMPOSITION

FIELD OF THE INVENTION

The invention is directed to the photonic curing of a polymer thick film (PTF) copper conductor composition for use in many different applications. In one embodiment, the PTF copper conductor composition is used as a screen-printed conductor on a thin film substrate such as a polyimide. The PTF copper conductor functions as a grid electrode. This composition may further be used for any other application where conductivity (low resistivity) is required.

BACKGROUND OF THE INVENTION

This invention is directed to a polymer thick film copper conductor composition for use in electronic devices. PTF silver conductors are quite prevalent in electronic circuitry as the conductor of choice due to the low resistivity (<50 milliohms/sq) and the reliability of silver. The price of silver is high and it is therefore becoming expensive to use in circuitry. Alternatives to silver are being sought with little compromise in electrical properties but at reduced cost. It is the purpose of this invention to provide such an alternative.

SUMMARY OF THE INVENTION

This invention provides a polymer thick film copper conductor composition comprising:
 (a) 60 to 95 wt % copper powder possessing particles with an average particle size of 0.2 to 10 µm and a surface area/mass ratio in the range of 0.2 to 3.0 m$^2$/g; dispersed in
 (b) 4 to 35 wt % organic medium comprising
  (1) 2-7 wt % resin at least half of which, by weight, is polyimide resin, dissolved in
  (2) an organic solvent;
 (c) 0.25 to 2 wt % reducing agent comprising an alcohol with no base properties; and
 (d) 0.0 to 2 wt % viscosity stabilizing agent comprising a carboxylic acid containing compound;
wherein the wt % are based on the total weight of the polymer thick film copper conductor composition.

In one embodiment all of the resin is polyimide resin.

In one embodiment the reducing agent is selected from the group consisting of glycerol, ethylene glycol, diethylene glycol and mixtures thereof.

In one embodiment, the viscosity stabilizing agent is an organic acid such as oleic acid, stearic acid or mixtures thereof.

The polymer thick film copper conductor composition can be cured by photonic sintering.

This invention also provides a method for forming an electrical conductor in an electrical circuit, comprising:
 a) providing a substrate;
 b) providing the polymer thick film copper conductor composition of the invention;
 c) applying said polymer thick film copper conductor composition onto said substrate; and
 d) subjecting said polymer thick film copper conductor composition to photonic sintering to form said electrical conductor.

In an embodiment, the method further comprises a step of drying the thick film copper conductor composition, wherein this step is carried out following step (c) but before step (d).

The composition is processed at a time and temperature necessary to remove all solvent. Photonic sintering after drying reduces the resistivity.

The invention also provides an electrical device comprising an electrical conductor formed using the polymer thick film copper conductor composition of the invention or formed by any of the embodiments of the above described method.

BRIEF DESCRIPTION OF THE FIGURE

The FIGURE illustrates the serpentine screen printed paste pattern used in the Comparative Experiment and the Examples.

DETAILED DESCRIPTION OF INVENTION

Generally, a thick film composition comprises a functional phase that imparts appropriate electrically functional properties to the composition. The functional phase comprises electrically functional powders dispersed in an organic medium that acts as a carrier for the functional phase. Generally, in thick film technology, the composition is fired to burn out the organics and to impart the electrically functional properties. However, in the case of polymer thick films, the organics, other than the solvent, remain as an integral part of the composition after drying. "Organics" as used herein comprise polymer, resin or binder components of the thick film composition. These terms may be used interchangeably and they all mean the same thing.

In one embodiment, the polymer thick film conductor copper composition is a polymer thick film copper conductor composition comprising a copper powder dispersed in an organic medium comprising a polymer resin and a solvent. The components used in this embodiment of the polymer thick film conductor copper composition are discussed below.

As used herein, weight percent is written as wt %.
Polymer Thick Film Copper Conductor Composition
A. Copper Conductor Powder The electrically functional powder in the polymer thick film copper conductor composition is a copper conductor powder The particle diameter and shape of the copper powder are particularly important and have to be appropriate to the application method. In one embodiment the particles are spherical in shape. In another embodiment the particles are in flake form. In still another embodiment the particles are irregular in shape. The particle size distribution of the copper particles is also critical with respect to the effectiveness of the invention. As a practical matter, the particle size is in the range of 1 to 100 µm. In an embodiment, the average particle size is 0.2 to 10 µm. In addition, the surface area/mass ratio of the copper particles is in the range of 0.2 to 3.0 m$^2$/g. In one embodiment, the copper particles have a flake form.

The polymer thick film copper conductor composition is comprised of 60 to 95 wt % copper powder, wherein the wt % is based on the total weight of the polymer thick film copper conductor composition.

Furthermore, it is known that small amounts of one or more other metals may be added to the copper conductor compositions to modify the properties of the conductor. Some examples of such metals include: gold, silver, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. The additional metal(s) may comprise up to about 1.0 percent by weight of the total composition.

B. Organic Medium

The copper powder is typically mixed with an organic medium (vehicle) by mechanical mixing to form a paste-like composition, called "paste", having suitable consistency and rheology for printing. The organic medium must be one in which the solids are dispersible with an adequate degree of stability. The rheological properties of the organic medium must be such that they lend good application properties to the composition. Such properties include: dispersion of solids with an adequate degree of stability, good application of composition, appropriate viscosity, thixotropy, appropriate wettability of the substrate and the solids, a good drying rate, and dried film strength sufficient to withstand rough handling.

The organic medium comprises a solution of resin in organic solvent(s). In an embodiment, at least half of the resin, by weight, is polyimide resin. In one embodiment all of the resin is polyimide resin.

In an embodiment, the polyimide resin is represented by formula I:

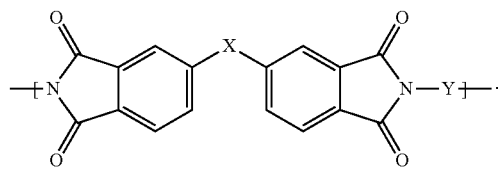

I wherein X is $C(CH_3)_2$, O, $S(O)_2$, $C(CF_3)_2$, O-Ph-$C(CH_3)_2$-Ph-O, O-Ph-O— or a mixture of two or more of $C(CH_3)_2$, O, $S(O)_2$, $C(CF_3)_2$, O-Ph-$C(CH_3)_2$-Ph-O, O-Ph-O—;
wherein Y is a diamine component or a mixture of diamine components selected from the group consisting of: m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), 4,4'-(Hexafluoroisopropylidene)bis(2-aminophenol) (6F-AP), bis-(4-(4-aminophenoxy)phenyl)sulfone (BAPS), 9,9-bis(4-aminophenyl)fluorene (FDA); 2,3,5,6-tetramethyl-1,4-phenylenediamine (DAM), 2,2-bis[4-(4-aminophenoxyphenyl)] propane (BAPP), 2,2-bis[4-(4-aminophenoxyphenyl)] hexafluoropropane (HFBAPP), 1,3-bis(3-aminophenoxy) benzene (APB-133), 2,2-bis(3-aminophenyl)hexafluoropropane, 2,2-bis(4 aminophenyl)hexafluoropropane (bis-A-AF), 4,4'-bis(4-amino-2-trifluoromethylphenoxy) biphenyl, 4,4'-[1,3-phenylenebis(1-methyl-ethylidene)], and bisaniline (bisaniline-M) with the proviso that:

i. if X is O, then Y is not m-phenylenediamine (MPD), bis-(4-(4-aminophenoxy)phenyl)sulfone (BAPS) and 3,4'-diaminodiphenyl ether (3,4'-ODA); BAPP, APB-133, or bisaniline-M;
ii. if X is $S(O)_2$, then Y is not 3,3'-diaminodiphenyl sulfone (3,3'-DDS);
iii. if X is $C(CF_3)_2$, then Y is not m-phenylenediamine (MPD), bis-(4-(4-aminophenoxy)phenyl)sulfone (BAPS), 9,9-bis(4-aminophenyl)fluorene (FDA), or 3,3'-diaminodiphenyl sulfone (3,3'-DDS); and
iv. if X is O-Ph-$C(CH_3)_2$-Ph-O or O-Ph-O—, then Y is not m-phenylene diamine (MPD), FDA, 3,4'-ODA, DAM, BAPP, APB-133, or bisaniline-M.

In one embodiment the polyimide can be prepared in the dry and powdered state by reacting monomers 2,2'-Bis(trifluoromethyl)-4,4'-diamino biphenyl (TFMB), 2,2Bis(3-amino-4-hydroxyphenyl)hexafluoropropane (6F-AP) and Hexafluoroisopropylidenebis-phthalic dianhydride. (6-FDA). in a ratio of 33/10/57 (TFMB/6F-AP/6-FDA) through the well-known process of first making polyamic acid in N,N-Dimethylacetamide (DMAC) solvent, controlling the molecular weight of said polyamic acid with end-capping additives, then chemically imidizing and precipitating the polyimide polymer using methanol neat additions to the DMAC solution. The precipitate was washed several times with methanol neat, filtered and then dried at approximately 200° C. to form a dry and handleable powder and to reduce DMAC residuals to below 0.1% weight. The resulting powder can be dried and stored at room temperature or dissolved in a solvent in preparation for forming the paste composition.

The polymer thick film copper conductor composition is comprised of 4 to 35 wt % organic medium, wherein the wt % is based on the total weight of the polymer thick film copper conductor composition. The organic medium is comprised of 2-7 wt % resin at least half of which, by weight, is polyimide resin, wherein the wt % is based on the total weight of the polymer thick film copper conductor composition C. Reducing Agent Copper powder will generally possess an outer oxide layer consisting of cupric oxide, cuprous oxide, copper hydroxide, or a mixture of two or more of these oxides. The oxide layer is an insulator and can thus inhibit the performance of the copper powder as a conductor. Consequently, the resistivity of the printed traces can be undesirably high. Therefore, the paste composition contains organic compounds that are capable of reducing the copper oxide layer to copper metal during the photonic sintering process. Organic compounds suited for this include alcohols with no base properties.

The polymer thick film copper conductor composition is comprised of 0.25 to 2 wt % reducing agent comprising an alcohol with no base properties, wherein the wt % is based on the total weight of the polymer thick film copper conductor composition. In one embodiment the reducing agent is selected from the group consisting of glycerol, ethylene glycol, diethylene glycol and mixtures thereof.

D. Viscosity Stabilizing Agent

The polymer thick film copper conductor composition is comprised of 0.0 to 2 wt % viscosity stabilizing agent comprising a carboxylic acid containing compound. In one embodiment, the viscosity stabilizing agent is an organic acid selected from the group consisting of oleic acid, stearic acid and mixtures thereof.

Application of Thick Films

The polymer thick film paste composition is deposited on a substrate typical of those used in electric devices. In a typical embodiment, the substrate is impermeable to gases and moisture. The substrate can be a sheet of flexible material. The flexible material can be an impermeable material such as a polyimide film, e.g. Kapton®. The material can also be a polyester, e.g. polyethylene terephthalate, or a composite material made up of a combination of plastic sheet with optional metallic or dielectric layers deposited thereupon. The substrate can be alumina, aluminum or any material that can withstand the process temperature.

The deposition of the polymer thick film conductive composition is performed preferably by screen printing, although other deposition techniques such as stencil printing, syringe dispensing or coating techniques can be utilized. In the case of screen-printing, the screen mesh size controls the thickness of deposited thick film.

The deposited thick film conductive composition may be dried, i.e., the solvent is evaporated, by exposure to heat, e.g. at 130° C. for minutes.

Photonic Sintering

Photonic sintering uses light to provide high-temperature sintering. Typically, a flash lamp is used to provide the source of light and is operated with a short on time of high power and a duty cycle ranging from a few hertz to tens of hertz. The photonic sintering step is brief, typically less than 1 minute. Photonic sintering may also be referred to as photonic curing. Examples of commercial manufacturers of photonic sintering equipment include NovaCentrix Corp. (Austin, Tex.) and Xenon Corp (Wilmington, Mass.)

The photonic sintering of the deposited thick film conductor composition provides conductors with low resistivity.

In one embodiment, prior to the photonic sintering, the deposited thick film conductor composition is dried by exposure to heat at low temperatures, typically for 5-10 min at 80° C. In another embodiment, the deposited thick film conductor composition is not dried prior to photonic sintering.

The present invention will be discussed in further detail by giving practical examples. The scope of the present invention, however, is not limited in any way by these practical examples.

EXAMPLES AND COMPARATIVE EXPERIMENTS

The substrates Kapton® (500HPP-ST) and the unclad FR-4 substrates were obtained from DuPont® and Moog Components, respectively, and used as received after cut into 2.5"×3.5" sizes. The low loss Itera substrates were obtained from Isola through Insulectro.

The polyimide resin used in the Examples was prepared as described above by reacting TFMB, 6F-AP and 6-FDA. in a ratio of 33/10/57.

The SAC alloy with a composition of Sn96.5% Ag3.0% Cu0.5% was used for solder wetting test. Either Alpha 611 or Kester 952 flux was used. In the solder wetting test the cured samples were typically dipped for 3-10 seconds into the SAC alloy pot that was kept at 225-250° C.

Comparative Experiment A

A screen printable PTF Cu conductor composition was prepared using copper flakes having an average particle size of 4 micron. An organic medium was prepared by dissolving a polyimide resin from St. Jean having a number average molecular weight of approximately 135,000 in a mixture of the solvents, butylcarbitol acetate, dibasic esters (DBE-3) and diethyl adipate. The organic medium contained 26 wt % resin, 31 wt % butylcarbitol acetate, 11 wt % dibasic esters (DBE-3) and 31 wt % diethyl adipate, wherein the wt % are based on the total weight of the organic medium. The copper powder was then dispersed in the organic medium.

The components of the PTF copper conductor composition were

| 75 wt % | copper powder |
| 20 wt % | organic medium |
| 2.2 wt % | triethanolamine |
| 1.2% | butylcarbitol acetate |
| 0.4 wt % | dibasic esters (DBE-3) |
| 1.2 wt % | diethyl adipate | wherein the wt % are based on the total weight of the composition.

The components were combined and mixed for 60 seconds in a Thinky-type mixer. However the paste became gelled shortly and was not suitable to be used in a screen printing process.

A PTF copper conductor paste was also prepared using diethanolamine in place of the triethanolamine in the composition described above. The paste also became gelled shortly and was not screen-printable.

Comparative Experiment B

A screen printable PTF Cu conductor composition was prepared using copper flakes having an average particle size of 4 micron. An organic medium was prepared by dissolving a Nichigo TP 249 polyester resin from Nippon Gohsei, Japan, in a mixture of the solvents, butylcarbitol acetate, dibasic esters (DBE-3) and diethyl adipate. The organic medium contained 26 wt % resin, 31 wt % butylcarbitol acetate, 11 wt % dibasic esters (DBE-3) and 31 wt % diethyl adipate, wherein the wt % are based on the total weight of the organic medium. The copper powder was then dispersed in the organic medium.

The components of the PTF copper conductor composition were

| 79.7 wt % | copper powder |
| 19 wt % | organic medium |
| 1.3 wt % | glycerol | wherein the wt % are based on the total weight of the composition.

The components were combined and mixed for 60 seconds in a Thinky-type mixer. The composition was used to screen print a 600 square serpentine pattern on Kapton® film. The serpertine pattern printed on Kapton® substrate is shown in the FIGURE. Using a 325 mesh stainless steel screen, several patterns were printed, and the copper paste was dried at 80° C. for 10 min. The samples yielded no measurable resistance.

The dried serpentine patterns were then subjected to photonic sintering. A PulseForge 3200 sintering unit manufactured by NovaCentrix (Austin, Tex.) was employed. The unit was operated in an arbitrary mode. The process settings were as follows: pulse voltage: 230 V, A pulse composing of five micropulses: 200, 100, 1500, 1500, and 1500 µsec to give energy equal to 3.3 J/cm$^2$, overlap factor: 2.2, web speed: 25 FPM. After processing, the measured line resistance was 50Ω. The average conductor thickness over the 600 square pattern was determined to be 11.4 µm using a profilometer. Therefore the resistivity was calculated to be 38 mΩ/□/mil.

Solder wettability and solder leach resistance was tested in the manner described above using the samples. As an example, the sample with a resistance of 35Ω showed the gridlines almost completely gone after being dipped in the SAC pot for 3 seconds

Comparative Experiment C

A screen printable PTF Cu conductor composition was prepared using copper flakes having an average particle size of 4 micron. An organic medium was prepared by dissolving a Nichigo TP 249 polyester resin from Nippon Gohsei, Japan, in a mixture of the solvents, butylcarbitol acetate, dibasic esters (DBE-3) and diethyl adipate. The organic medium contained 40 wt % resin, 30 wt % butylcarbitol acetate, and 30 wt % diethyl adipate, wherein the wt % are based on the total weight of the organic medium. The copper powder was then dispersed in the organic medium.

The components of the PTF copper conductor composition were

| | |
|---|---|
| 73.6 wt % | copper powder |
| 24.6 wt % | organic medium |
| 1.8 wt % | glycerol | wherein the wt % are based on the total weight of the composition.

The components were combined and mixed for 60 seconds in a Thinky-type mixer. The composition was used to screen print a 600 square serpentine pattern on Kapton® film. The serpentine pattern printed on Kapton® substrate is shown in the FIGURE. Using a 325 mesh stainless steel screen, several patterns were printed, and the copper paste was dried at 80° C. for 10 min. The samples yielded no measurable resistance.

The dried serpentine patterns were then subjected to photonic sintering. A PulseForge 3200 sintering unit manufactured by NovaCentrix (Austin, Tex.) was employed. The unit was operated in an arbitrary mode. The process settings were as follows: pulse voltage: 215 V, A pulse composing of five micropulses: 200, 100, 1500, 1500, and 1500 μsec to give energy equal to 2.8 J/cm$^2$, overlap factor: 2.2, web speed: 25 FPM. After processing, the measured line resistance was 47Ω. The average conductor thickness over the 600 square pattern was determined to be 10.4 μm using a profilometer. Therefore the resistivity was calculated to be 19.6 mΩ/☐/mil.

Solder wettability and solder leach resistance was tested in the manner described above using the samples. As an example, the sample with 38.4Ω showed the gridlines almost completely gone after being dipped in the SAC pot for 3 seconds.

Comparative Experiment D

A PTF copper conductor composition was prepared using copper flake (CI-4000F, Ames Goldsmith Corp, South Glen Falls, N.Y.) having an average particle size of 4 μm. An organic medium was prepared by dissolving a phenoxy resin (PKHH® resin from InChem Corp) having a number average molecular weight of approximately 20,000 in the solvent, Dowanol® DPM dipropylene glycol methyl ether ((Dow Chemical Co., Midland, Mich.). The organic medium contained 20 wt % resin and 80 wt % solvent, wherein the wt % are based on the total weight of the organic medium. The copper powder was then dispersed in the organic medium.

The components of the PTF copper conductor composition were

| | |
|---|---|
| 73.5 wt % | copper powder |
| 17.5 wt % | organic medium |
| 1.7 wt % | glycerol |
| 7.3 wt % | Dowanol ® DPM | wherein the wt % are based on the total weight of the composition.

The components were combined and mixed for 60 seconds in a Thinky-type mixer. The composition was used to screen print a 600 square serpentine pattern on Kapton® film. The serpentine pattern printed on Kapton® substrate is shown in the FIGURE. Using a 325 mesh stainless steel screen, several patterns were printed, and the copper paste was dried at 80° C. for 10 min. The samples yielded no measurable resistance.

The dried serpentine patterns were then subjected to photonic sintering. A PulseForge 3200 sintering unit manufactured by NovaCentrix (Austin, Tex.) was employed. The unit was operated in an arbitrary mode. The process settings were as follows: pulse voltage: 230 V, A pulse composing of five micropulses: 200, 100, 1500, 1500, and 1500 μsec to give energy equal to 3.3 J/cm$^2$, overlap factor: 2.2, web speed: 25 FPM. After processing, the measured line resistance was 68 0. The average conductor thickness over the 600 square pattern was determined to be 9.4 μm using a profilometer. Therefore the resistivity was calculated to be 42.6 mΩ/☐/mil.

Solder wettability was tested in the manner described above using these samples. The samples showed poor solder leach resistance. For an example, a sample dipped in the SAC alloy pot for 3 seconds showed about 25% delamination (line breaks).

Example 1

A screen printable PTF Cu conductor composition was prepared using copper flakes having an average particle size of 4 micron. An organic medium was prepared by dissolving a polyimide resin from St. Jean having a number average molecular weight of approximately 135,000 in a mixture of the solvents, butylcarbitol acetate, dibasic esters (DBE-3) and diethyl adipate. The organic medium contained 26 wt % resin, 31 wt % butylcarbitol acetate, 11 wt % dibasic esters (DBE-3) and 31 wt % diethyl adipate, wherein the wt % are based on the total weight of the organic medium. The copper powder was then dispersed in the organic medium.

The components of the PTF copper conductor composition were

| | |
|---|---|
| 73.5 wt % | copper powder |
| 17.3 wt % | organic medium |
| 1.7 wt % | glycerol |
| 3% | butylcarbitol acetate |
| 1.5 wt % | dibasic esters (DBE-3) |
| 3 wt % | diethyl adipate | wherein the wt % are based on the total weight of the composition.

The components were combined and mixed for 60 seconds in a Thinky-type mixer. The composition was used to screen print a 600 square serpentine pattern on Kapton® film. The serpentine pattern printed on Kapton® substrate is shown in the FIGURE. Using a 325 mesh stainless steel screen, several patterns were printed, and the copper paste was dried at 80° C. for 10 min. The samples yielded no measurable resistance.

The dried serpentine patterns were then subjected to photonic sintering. A PulseForge 3200 sintering unit manufactured by NovaCentrix (Austin, Tex.) was employed. The unit was operated in an arbitrary mode. The process settings were as follows: pulse voltage: 230 V, A pulse composing of five micropulses: 200, 100, 1500, 1500, and 1500 μsec to give energy equal to 3.3 J/cm$^2$, overlap factor: 2.2, web speed: 25 FPM. After processing, the measured line resistance was 32.6Ω. The average conductor thickness over the 600 square pattern was determined to be 9.8 μm using a profilometer. Therefore the resistivity was calculated to be 21.2 mΩ/□/mil.

Solder wettability and solder leach resistance was tested in the manner described above using the samples. As examples, a sample with a resistance of 33Ω dipped in the solder pot for 10 seconds showed no solder wetting and a resistance of 30.2Ω after dipped in the SAC pot for 10 seconds. In contrast about 40% solder wetting was observed from the sample dipped in the solder pot for 3 seconds, however, the sample dipped for 5 seconds showed no solder wetting. No defects such as voids or line delamination were detected from any of the samples.

The composition was also used to screen print a 600 square serpentine pattern on 0.028 inch-thick FR-4 and 0.030 inch-thick Itera substrates. Using a 325 mesh stainless steel screen, several patterns were printed, and the copper paste was dried at 80° C. for 10 min. The samples yielded no measurable resistance.

The dried serpentine patterns were then subjected to photonic sintering using the same profile used for curing the samples prepared on Kapton® substrates. After processing, the measured line resistance was 41.5Ω on FR-4, and 59.6Ω on Itera. The average conductor thickness over the 600 square pattern was determined to be 11.2 μm on FR-4 and 11.4 μm on Itera using a profilometer, which gave the calculated resistivity of 31 and 45 mΩ/□/mil, respectively.

Example 2

A screen printable PTF Cu conductor composition was prepared using copper flakes having an average particle size of 4 micron. An organic medium was prepared by dissolving a polyimide resin from St. Jean having a number average molecular weight of approximately 135,000 in a mixture of the solvents, butylcarbitol acetate, dibasic esters (DBE-3) and diethyl adipate. The organic medium contained 26 wt % resin, 31 wt % butylcarbitol acetate, 11 wt % dibasic esters (DBE-3) and 31 wt % diethyl adipate, wherein the wt % are based on the total weight of the organic medium. The copper powder was then dispersed in the organic medium.

The components of the PTF copper conductor composition were

| | |
|---|---|
| 73.5 wt % | copper powder |
| 17.3 wt % | organic medium |
| 0.7 wt % | glycerol |
| 1 wt % | diethylene glycol |
| 3% | butylcarbitol acetate |
| 1.5 wt % | dibasic esters (DBE-3) |
| 3 wt % | diethyl adipate | wherein the wt % are based on the total weight of the composition.

The components were combined and mixed for 60 seconds in a Thinky-type mixer. The composition was used to screen print a 600 square serpentine pattern on Kapton® film. The serpertine pattern printed on Kapton® substrate is shown in the FIGURE. Using a 325 mesh stainless steel screen, several patterns were printed, and the copper paste was dried at 80° C. for 10 min. The samples yielded no measurable resistance.

The dried serpentine patterns were then subjected to photonic sintering. A PulseForge 3200 sintering unit manufactured by NovaCentrix (Austin, Tex.) was employed. The unit was operated in an arbitrary mode. The process settings were as follows: pulse voltage: 230 V, A pulse composing of five micropulses: 200, 100, 1500, 1500, and 1500 μsec to give energy equal to 3.3 J/cm$^2$, overlap factor: 2.2, web speed: 25 FPM. After processing, the measured line resistance was 33.6Ω. The average conductor thickness over the 600 square pattern was determined to be 9.6 μm using a profilometer. Therefore the resistivity was calculated to be 21.5 mΩ/□/mil.

Solder wettability and solder leach resistance was tested in the manner described above using the samples. As examples, a sample with 29.2Ω showed no solder wetting and resistance of 22.5Ω after dipped in the SAC pot for 10 seconds. In contrast about 50 and 20% solder wetting were observed from the samples dipped in the solder pot for 3 or 5 seconds, respectively. No defects such as delamination or voids were observed from the solder-dipped samples.

Example 3

A screen printable PTF Cu conductor composition was prepared using copper flakes having an average particle size of 4 micron. A polyimide organic medium was prepared by dissolving a polyimide resin (27 wt %) from St. Jean having a number average molecular weight of approximately 135,000 in a mixture of the solvents, butylcarbitol acetate (31 wt %), dibasic esters (DBE-3, 11 wt %) and diethyl adipate (31 wt %). A phenoxy organic medium was prepared by dissolving a phenoxy resin (PKHH® resin from InChem Corp, 20 wt %) in Dowanol® DPM (80%), wherein the wt % are based on the total weight of the organic medium. The copper powder was then dispersed in the organic medium.

The components of the PTF copper conductor composition were

| | |
|---|---|
| 73.5 wt % | copper powder |
| 13.8 wt % | polyimide organic medium |
| 3.5 wt % | phenoxy organic medium |
| 1.7 wt % | glycerol |
| 2.4% | butylcarbitol acetate |
| 1.2 wt % | dibasic esters (DBE-3) |
| 2.4 wt % | diethyl adipate |
| 1.5 wt % | Dowanol ® DPM | wherein the wt % are based on the total weight of the composition.

The components were combined and mixed for 60 seconds in a Thinky-type mixer. The composition was used to screen print a 600 square serpentine pattern on Kapton® film. The serpertine pattern printed on Kapton® substrate is shown in the FIGURE. Using a 325 mesh stainless steel screen, several patterns were printed, and the copper paste was dried at 80° C. for 10 min. The samples yielded no measurable resistance.

The dried serpentine patterns were then subjected to photonic sintering. A PulseForge 3200 sintering unit manufactured by NovaCentrix (Austin, Tex.) was employed. The unit was operated in an arbitrary mode. The process settings were as follows: pulse voltage: 230 V, A pulse composing of five micropulses: 200, 100, 1500, 1500, and 1500 μsec to give energy equal to 3.3 J/cm², overlap factor: 2.2, web speed: 25 FPM. After processing, the measured line resistance was 44Ω. The average conductor thickness over the 600 square pattern was determined to be 10 μm using a profilometer. Therefore the resistivity was calculated to be 26.3 mΩ/□/mil.

Solder wettability and solder leach resistance was tested in the manner described above using the samples. As examples, a sample with 46.9Ω showed over 90% solder wetting a resistance of 25.8Ω after dipped in the SAC pot for 3 seconds with no defects formed, and the samples dipped for 5 or 10 seconds showed 60-80% solder wetting but minor defects such as delamination or voids.

Example 4

A screen printable PTF Cu conductor composition was prepared using copper flakes having an average particle size of 4 micron. An organic medium was prepared by dissolving a polyimide resin from St. Jean having a number average molecular weight of approximately 135,000 in a mixture of the solvents, butylcarbitol acetate, dibasic esters (DBE-3) and diethyl adipate. The organic medium contained 26 wt % resin, 31 wt % butylcarbitol acetate, 11 wt % dibasic esters (DBE-3) and 31 wt % diethyl adipate, wherein the wt % are based on the total weight of the organic medium. The copper powder was then dispersed in the organic medium.

The components of the PTF copper conductor composition were

| | |
|---|---|
| 71.3 wt % | copper powder |
| 16.4 wt % | organic medium |
| 0.5 wt % | glycerol |
| 5.7 wt % | butylcarbitol acetate |
| 5.6 wt % | dibasic esters (DBE-3) |
| 0.5 wt % | oleic acid | wherein the wt % are based on the total weight of the composition.

The components were combined and mixed for 60 seconds in a Thinky-type mixer. The composition was used to screen print a 600 square serpentine pattern on Kapton® film. The serpertine pattern printed on Kapton® substrate is shown in the FIGURE. Using a 325 mesh stainless steel screen, several patterns were printed, and the copper paste was dried at 80° C. for 10 min. The samples yielded no measurable resistance.

The dried serpentine patterns were then subjected to photonic sintering. A PulseForge 3200 sintering unit manufactured by NovaCentrix (Austin, Tex.) was employed. The unit was operated in an arbitrary mode. The process settings were as follows: pulse voltage: 230 V, A pulse composing of five micropulses: 200, 100, 1500, 1500, and 1500 μsec to give energy equal to 3.3 J/cm², overlap factor: 2.2, web speed: 25 FPM. After processing, the measured line resistance was 39.8Ω. The average conductor thickness over the 600 square pattern was determined to be 8.3 μm using a profilometer. Therefore the resistivity was calculated to be 22 mΩ/□/mil.

Solder wettability and solder leach resistance was tested in the manner described above using the samples. As examples, a sample with 40.2Ω showed about 40% solder wetting with a resistance of 26.6Ω after dipped in the SAC pot for 3 seconds, and the sample with 38.8Ω dipped for 10 seconds showed about 70% solder wetting and a resistance of 24.5Ω. No defects such as delamination or voids were observed from the solder-dipped samples.

What is claimed is:

1. A polymer thick film copper conductor composition comprising:
   (a) 60 to 95 wt % copper powder possessing particles with an average particle size of 0.2 to 10 μm and a surface area/mass ratio in the range of 0.2 to 3.0 m²/g; dispersed in
   (b) 4 to 35 wt % organic medium comprising
      (1) 2-7 wt % resin at least half of which, by weight, is polyimide resin, dissolved in
      (2) an organic solvent;
   (c) 0.25 to 2 wt % reducing agent comprising an alcohol with no base properties; and
   (d) 0.0 to 2 wt % viscosity stabilizing agent comprising a carboxylic acid containing compound;
   wherein the wt % are based on the total weight of the polymer thick film copper conductor composition.

2. The polymer thick film copper conductor composition of claim 1, wherein said reducing agent is selected from the group consisting of consisting of glycerol, ethylene glycol, diethylene glycol and mixtures thereof.

3. The polymer thick film copper conductor composition of claim 2, wherein said reducing agent is glycerol.

4. The polymer thick film copper conductor composition of claim 1, wherein said viscosity stabilizing agent is selected from the group consisting of oleic acid, stearic acid and mixtures thereof.

5. The polymer thick film copper conductor composition of claim 4, wherein said viscosity stabilizing agent is oleic acid.

6. An electrical device comprising an electrical conductor formed from the polymer thick film copper conductor composition of claim 1.

7. A method for forming an electrical conductor in an electrical circuit, comprising:
   a) providing a substrate;
   b) providing a polymer thick film copper conductor composition comprising:
      (i) 60 to 95 wt % copper powder possessing particles with an average particle size of 0.2 to 10 μm and a surface area/mass ratio in the range of 0.2 to 3.0 m²/g; dispersed in
      (ii) 4 to 35 wt % organic medium comprising
         (1) 2-7 wt % resin at least half of which, by weight, is polyimide resin, dissolved in
         (2) an organic solvent;
      (iii) 0.25 to 2 wt % reducing agent comprising an alcohol with no base properties; and
      (iv) 0.0 to 2 wt % viscosity stabilizing agent comprising a carboxylic acid containing compound;
      wherein the wt % are based on the total weight of the polymer thick film copper conductor composition;
   c) applying said polymer thick film copper conductor composition onto said substrate; and
   d) subjecting said polymer thick film copper conductor composition to photonic sintering to form said electrical conductor.

8. The method of claim 7, said method further comprising a step of drying said polymer thick film conductor composition, wherein said step of drying is carried out following step (c) but before step (d).

9. The method of claim 7, wherein said reducing agent is selected from the group consisting of consisting of glycerol, ethylene glycol, diethylene glycol and mixtures thereof.

10. The method of claim 9, wherein said reducing agent is glycerol.

11. The method of claim 7, wherein said viscosity stabilizing agent is selected from the group consisting of oleic acid, stearic acid and mixtures thereof.

12. The method of claim 11, wherein said viscosity stabilizing agent is oleic acid.

13. An electrical device comprising an electrical conductor formed by the method of claim 7.

* * * * *